United States Patent
Roberts et al.

(10) Patent No.: US 6,596,632 B2
(45) Date of Patent: Jul. 22, 2003

(54) METHOD FOR FORMING AN INTEGRATED CIRCUIT INTERCONNECT USING A DUAL POLY PROCESS

(75) Inventors: Martin C. Roberts, Boise, ID (US); Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/805,546

(22) Filed: Mar. 13, 2001

(65) Prior Publication Data

US 2001/0012691 A1 Aug. 9, 2001

Related U.S. Application Data

(60) Continuation of application No. 09/135,111, filed on Aug. 17, 1998, now Pat. No. 6,200,892, which is a division of application No. 08/390,714, filed on Feb. 17, 1995.

(51) Int. Cl.[7] .............................................. H01L 21/44
(52) U.S. Cl. ..................... 438/657; 438/659; 438/664; 438/672
(58) Field of Search ................... 438/657, 672, 438/684, 659, 664, 639

(56) References Cited

U.S. PATENT DOCUMENTS

| | | | |
|---|---|---|---|
| 4,619,037 A | 10/1986 | Taguchi et al. | 29/578 |
| 4,874,719 A | 10/1989 | Kurosawa | 437/195 |
| 4,902,640 A | 2/1990 | Sachitano et al. | 437/57 |
| 4,908,324 A | 3/1990 | Nihira et al. | 437/31 |
| 4,948,756 A | 8/1990 | Ueda | 437/195 |
| 5,219,793 A | 6/1993 | Cooper et al. | 437/195 |
| 5,243,220 A | 9/1993 | Shibata et al. | 257/748 |
| 5,244,835 A | 9/1993 | Hachiya | 437/186 |
| 5,245,794 A | 9/1993 | Salugsugan | 51/165.74 |
| 5,279,990 A | 1/1994 | Sun et al. | 437/195 |
| 5,292,676 A | 3/1994 | Manning | 437/46 |
| 5,324,672 A | 6/1994 | Anmo et al. | 437/31 |
| 5,376,577 A | 12/1994 | Roberts et al. | 437/52 |
| 5,416,736 A | 5/1995 | Kosa et al. | 365/174 |
| 5,479,048 A | 12/1995 | Yallup et al. | 257/621 |
| 5,506,172 A * | 4/1996 | Tang | 437/189 |
| 5,541,429 A | 7/1996 | Shibib | 257/329 |
| 5,563,098 A | 10/1996 | Kuo et al. | 437/191 |
| 5,666,007 A | 9/1997 | Chung | 257/751 |
| 5,683,939 A | 11/1997 | Schrantz et al. | 437/195 |
| 5,888,902 A | 3/1999 | Jun | 438/637 |

FOREIGN PATENT DOCUMENTS

| | | | |
|---|---|---|---|
| EP | 0526244 | 2/1993 | |
| JP | 60-229366 | 11/1985 | |
| JP | 01160038 | 6/1989 | H01L/21/90 |
| JP | 03019342 | 1/1991 | H01L/21/3205 |
| JP | 6-53327 | 2/1994 | |
| JP | 6283688 | 10/1994 | |

OTHER PUBLICATIONS

US 5,701,036, 12/1997, Tang (withdrawn)
Stanley Wolf and Richard N. Tauber, "Silicon Processing for the VLSI Era—vol. 1: Process Technology," Lattice Press, Sunset Beach, California (1986), pp. 175–177.*

* cited by examiner

Primary Examiner—Carl Whitehead, Jr.
Assistant Examiner—Stephen W. Smoot
(74) Attorney, Agent, or Firm—Schwegman, Lundberg, Woessner & Kluth, P.A.

(57) ABSTRACT

A method for forming an electrical interconnect overlying a buried contact region of a substrate is characterized by a deposition of a first polycrystalline silicon layer and the patterning and etching of same to form a via. The via is formed in the first polycrystalline silicon layer to expose the substrate and a second polycrystalline silicon layer is formed in the via to contact the substrate. Portions of the second polycrystalline silicon layer overlying the first polycrystalline silicon layer are removed eliminating any horizontal interface between the two polycrystalline silicon layers. The first polycrystalline silicon layer remaining after the etch is then patterned to form an electrical interconnect.

40 Claims, 9 Drawing Sheets

US 6,596,632 B2

METHOD FOR FORMING AN INTEGRATED CIRCUIT INTERCONNECT USING A DUAL POLY PROCESS

This application is a Continuation of U.S. application Ser. No. 09/135,111, filed Aug. 17, 1998, now U.S. Pat. No. 6,200,892, which is a Divisional of U.S. application Ser. No. 08/390,714, filed Feb. 17, 1995.

FIELD OF THE INVENTION

The invention is related to fabrication of a semiconductor, and more particularly to the fabrication of a polycrystalline silicon interconnect.

BACKGROUND ART

In some semiconductor buried contact applications upper 1 and lower 2 polycrystalline silicon layers form an electrical interconnect 3 to a substrate, see FIG. 1A. In the process for forming the electrical interconnect 3 polycrystalline silicon layer 1 is masked to define the electrical interconnect 3. Polysilicon 1, overlying polycrystalline silicon 2, and polycrystalline silicon 2 are etched to form the interconnect according to the mask. Typically a defect can occur along the horizontal interface between the upper 1 and lower 2 polycrystalline silicon layers. In one case the defect degrades the integrity of the electrical contact by preventing etching of the lower polycrystalline silicon layer in areas which are exposed during etching. This polycrystalline silicon which is not etched when intended can bridge between two poly interconnects thereby causing malfunctions in the part.

In one solution a single poly process is used, see FIG. 1B. In the single poly process a single layer of polycrystalline silicon is deposited and masked to form an electrical interconnect 4. However contamination problems occur at the poly/oxide interface during buried contact formation when the single poly process is used. In addition a required hydro-fluoric acid etch thins the gate oxide layer creating a non uniform gate oxide.

In addition when patterning a polycrystalline silicon above a buried contact region, trenching of the substrate and exposure of the buried contact region often occur due to misalignment. Thus a need exists to protect the buried contact from exposure and trenching during gate patterning. In one solution a buried contact cap is used to protect the buried contact region. However a parasitic transistor is formed around the contact cap thereby degrading the performance of the device. In one solution an implant mask has been added to lower contact resistance and eliminate parasitic transistor problems.

Thus a need exits for a method having minimal contamination when forming a polycrystalline silicon interconnect which has integrity within the contact without reflective notching. The method must also retain a conformal gate oxide layer without trenching or exposing the substrate.

SUMMARY OF THE INVENTION

The invention is a method for forming an electrical interconnect, typically of polycrystalline silicon (although amorphous silicon or other electrically conductive materials may be used), overlying a buried contact region of a substrate. A first electrically conductive layer, typically of polycrystalline silicon (poly 1), is deposited to overlie the substrate. The poly 1 is patterned and etched to form a via thereby exposing the substrate. A second electrically conductive layer, typically of polycrystalline silicon (poly 2), is deposited to overlie the substrate and the poly 1 layer. In a first embodiment the poly 2 layer is chemically mechanically planarized to remove the poly 2 layer overlying the poly 1 layer thereby eliminating a horizontal interface between the poly 1 and the poly 2 layers.

In a second embodiment a layer resistant to a polycrystalline silicon etch is created prior to the patterning and etch of the poly 1 layer and prior to the deposition of the poly 2 layer. This layer will be referred to as a first polycrystalline silicon etch stop layer or just first etch stop layer. The first etch stop layer is patterned and etched to expose the poly 1 in the buried contact region. The poly 1 layer is then etched to expose the buried contact region of the substrate and poly 2 is deposited to overlie the remaining first etch stop layer and buried contact region. The poly 2 is then removed to expose the etch stop layer. Poly 2 remains in the via.

At this juncture a layer which is capable of reacting with silicon to form a silicon etch stop layer is deposited to overlie the first etch stop layer and the second polycrystalline silicon layer. A reaction is created between the second polycrystalline silicon layer and the layer which is capable of reacting with silicon, typically titanium. A second etch stop layer, resistant to a polycrystalline silicon etch, is formed overlying the poly 2 layer as a result of the reaction. The first etch stop layer functions as a protective layer during the reaction to prohibit a reaction between the poly 1 layer and the layer which is capable of reacting with silicon. The second etch stop layer eliminates trenching and exposure of the substrate even with gross misalignment of the photoresist mask during an etch of the poly 1 to form the interconnect.

In a further embodiment the invention is a semiconductor interconnect for electrically connecting a first region of a substrate and a second region of the substrate. The semiconductor interconnect comprises an electrically conductive silicon plug overlying and in electrical contact with the first region and the second region and an electrically conductive silicon layer, without a silicon interface horizontal to the substrate. The electrically conductive silicon layer is electrically isolated from the substrate and interposed between the silicon plug overlying the first region and the silicon plug overlying the second region. The interface between the silicon plug overlying the first region and the silicon layer is vertical to the substrate as is the interface between the silicon plug overlying the second region and the silicon layer.

BRIEF DESCRIPTION OF THE DRAWINGS

FIG. 2–12 depict the steps of the invention in cross section.

In FIG. 8 a titanium layer has been deposited to overlie the etch stop layer and second polycrystalline silicon layer of FIG. 5B.

In FIG. 9 an etch stop layer is formed overlying the second polycrystalline silicon layer and the titanium is removed.

In FIG. 10 the etch stop layer of FIG. 2B is removed.

In FIG. 11 a gate region is patterned and the first polycrystalline silicon layer is removed in unmasked regions.

In FIG. 12 the pattern has been removed.

DETAILED DESCRIPTION OF THE INVENTION

The invention is a method for forming an electrical interconnect of polycrystalline silicon overlying a buried contact region of a substrate. The method is depicted in cross section in FIGS. 2–12.

Figure 1A:
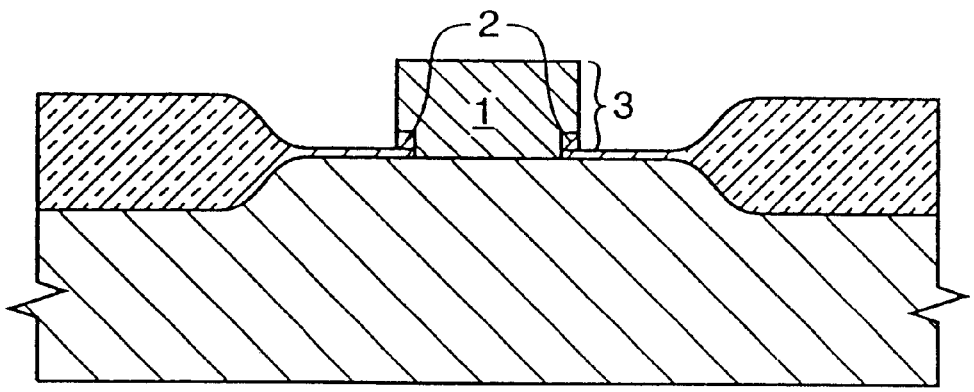
FIGS. 1A and 1B are cross-sectional views of electrical interconnects of the related art.
Figure 1B:
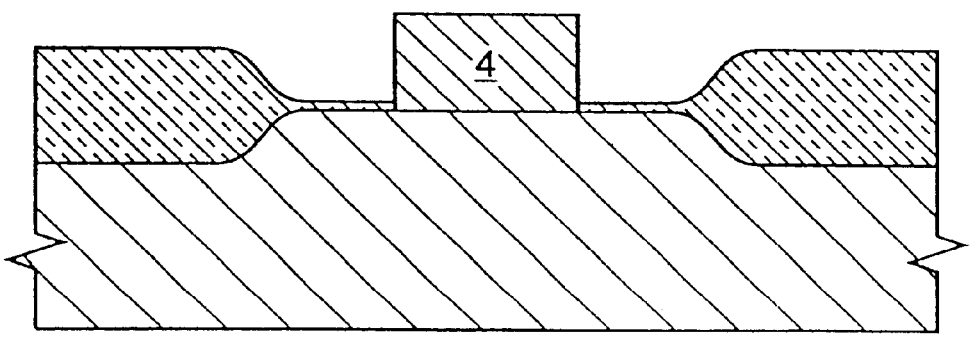
Figure 2A:
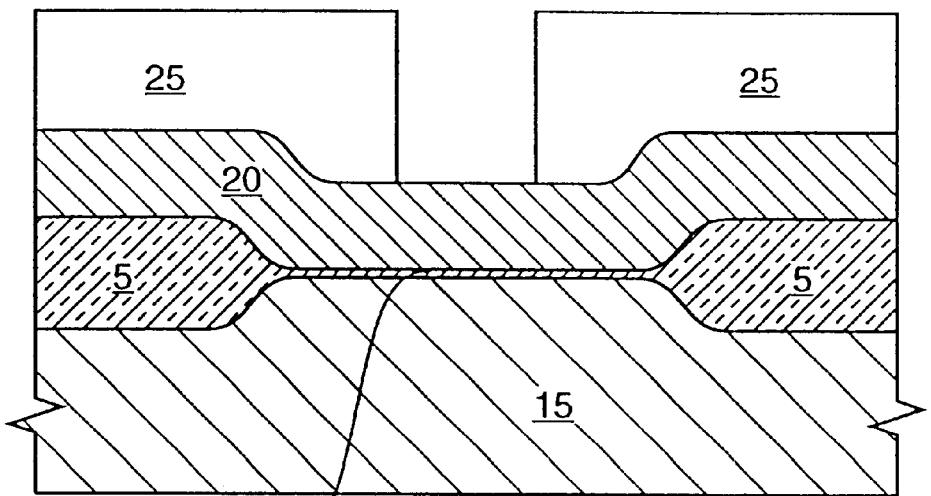
In FIG. 2A a first polycrystalline silicon layer has been deposited to overlie a substrate and has been patterned to define a buried contact region.
Figure 2B:
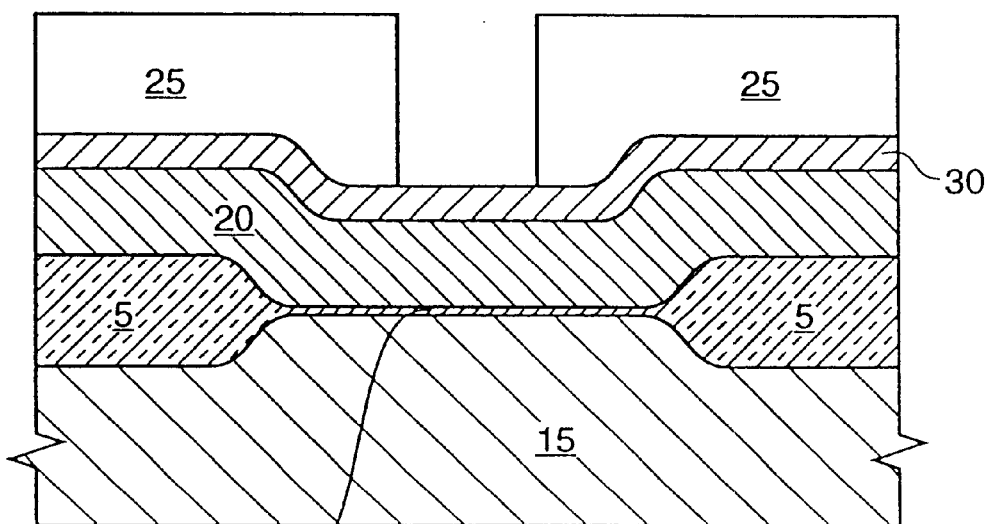
In FIG. 2B a first polycrystalline silicon layer and an etch stop layer have been deposited to overlie a substrate and have been patterned to define a buried contact region.

In the embodiments shown in FIGS. 2A and 2B field oxide regions 5 and a gate oxide layer 10 are formed by conventional methods to overlie a substrate 15. A first polycrystalline silicon layer 20 (poly 1) is deposited to overlie the field oxide regions 5 and gate oxide 10. The thickness of the first polycrystalline silicon layer 20 is selected such that the lowest upper surface of the first polycrystalline silicon layer 20 is higher than the highest upper surface of the field oxide regions 5. The polycrystalline silicon layer 20 is then patterned with photoresist mask 25.

In the second embodiment, shown in FIG. 2B, a polycrystalline silicon etch stop layer 30, also referred to as just etch stop layer 30, is deposited to overlie the first polycrystalline silicon layer 20 prior to patterning with photoresist mask 25. The etch stop layer is irresponsive to a polycrystalline silicon etch. In this embodiment the etch stop layer is oxide although nitride or some other material may also be used.

Figure 3A:
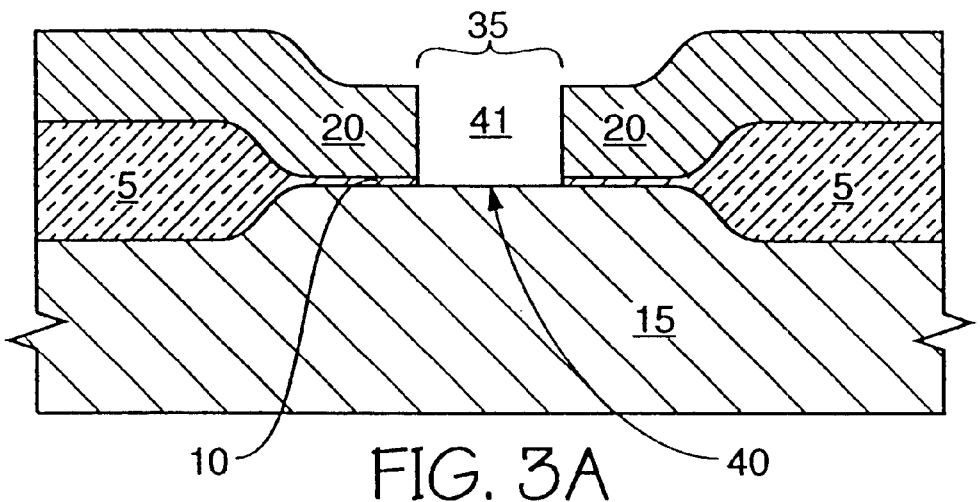
In FIGS. 3A and 3B the substrate has been exposed.
Figure 3B:
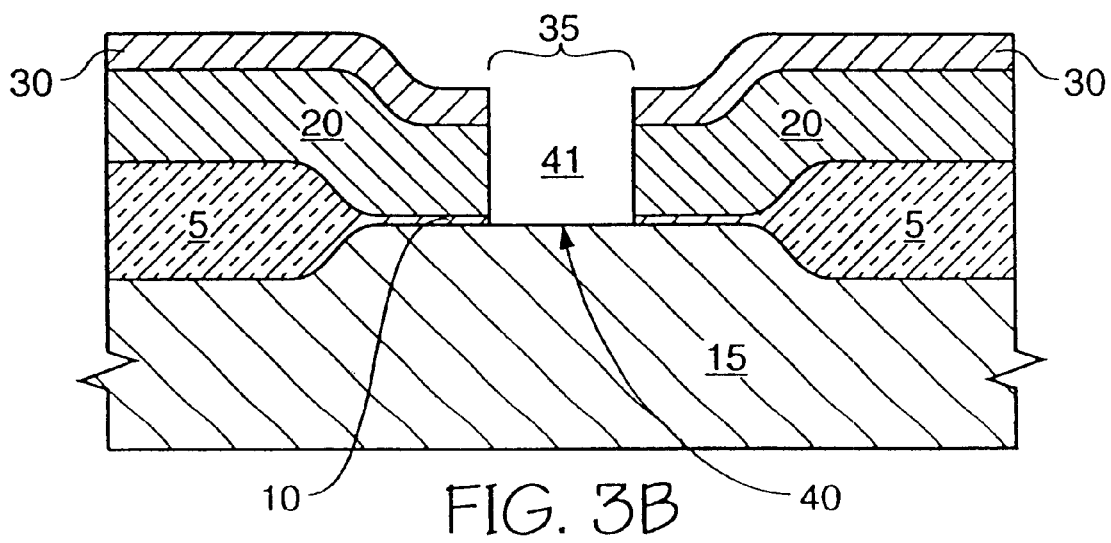

Next the first polycrystalline silicon layer 20 and the gate oxide layer 10 are etched by conventional methods in unmasked region 35 to exposed the buried contact portion 40 of the substrate 15, thereby forming a via 41. This is shown in FIGS. 3A and 3B for the first and the second embodiments respectively. In the second embodiment, see FIG. 3B, a separate etch is conducted prior to the polycrystalline silicon etch to remove the etch stop layer 30 in the unmasked region 35. Subsequent to the formation of via 41 the photoresist mask 25 are removed.

Figure 4A:
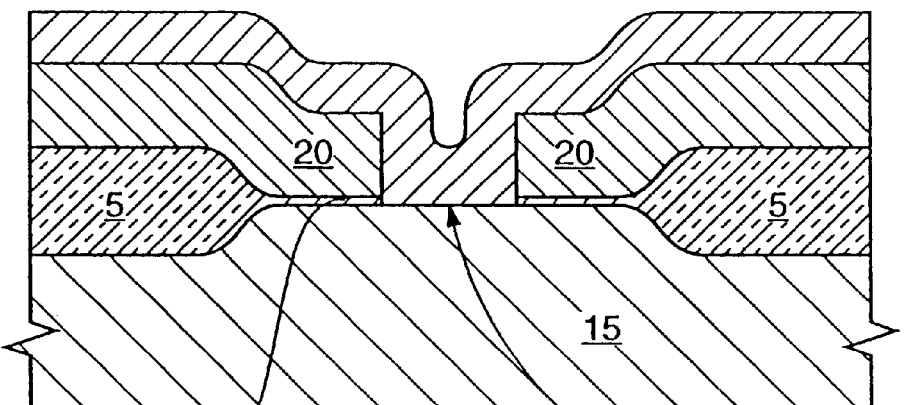
In FIGS. 4A and 4B a second polycrystalline silicon layer has been deposited.
Figure 4B:
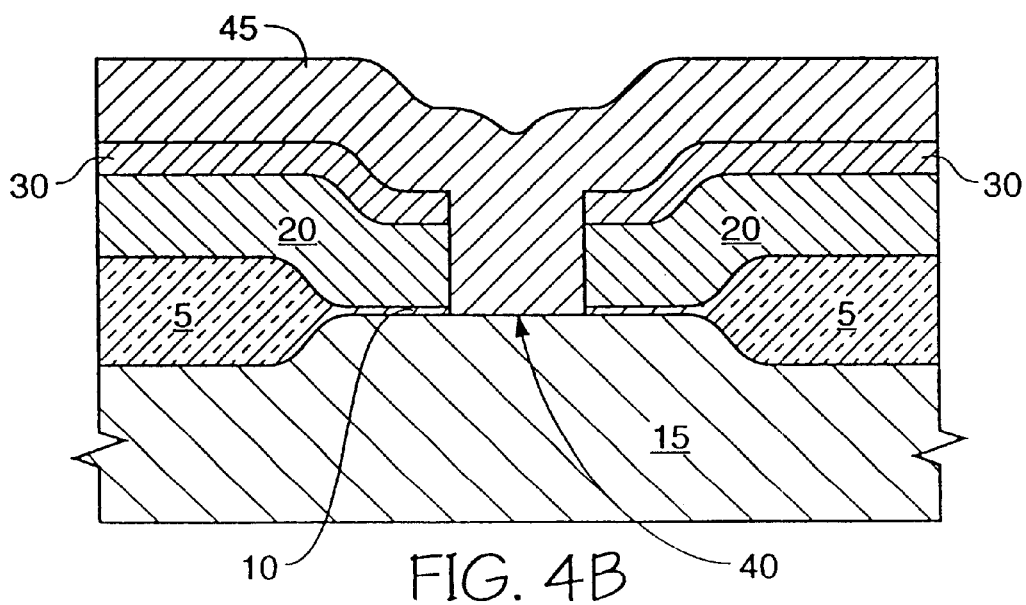

In FIGS. 4A and 4B of the first and second embodiments a second polycrystalline silicon layer 45 (poly 2) is deposited to overlie the first polycrystalline silicon layer 20 and the buried contact portion 40. In the second embodiment the second polycrystalline silicon layer 45 also overlies the etch stop layer 30 and must be thick enough to fill the via 41.

Figure 5A:
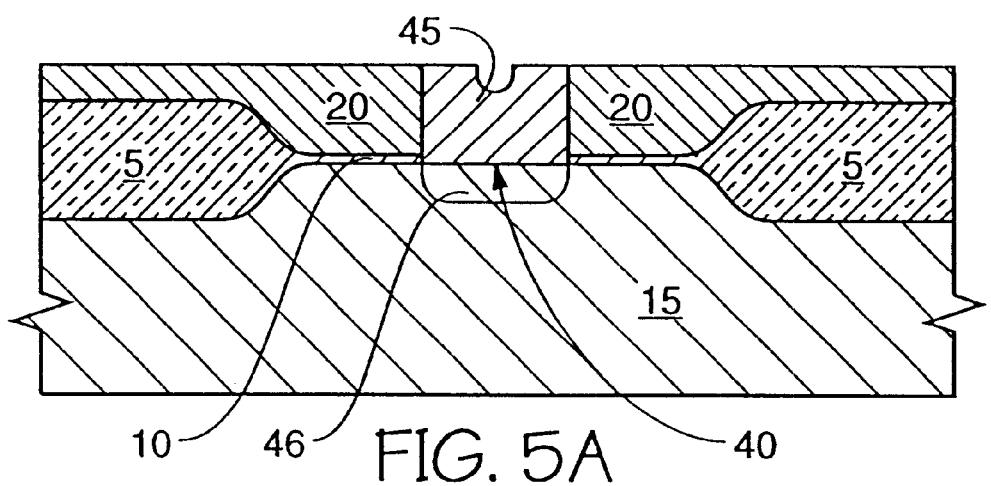
In FIGS. 5A and 5B the second polycrystalline silicon layer has been removed in areas overlying the first polycrystalline silicon layer.

In the first embodiment, see FIG. 5A, a chemical mechanical planarization removes the second polycrystalline silicon 45 overlying the first polycrystalline silicon layer 20 to expose the first polycrystalline silicon layer 20 thereby eliminating a poly 1 and poly 2 horizontal interface. It can be seen that the height of the first polycrystalline layer 20 defines the height of the second polycrystalline silicon layer 45 after the planarization. There may be some loss of the original height of the first polycrystalline layer 20 due to a loss during the chemical mechanical planarization, but it is typically negligible.

Figure 5B:
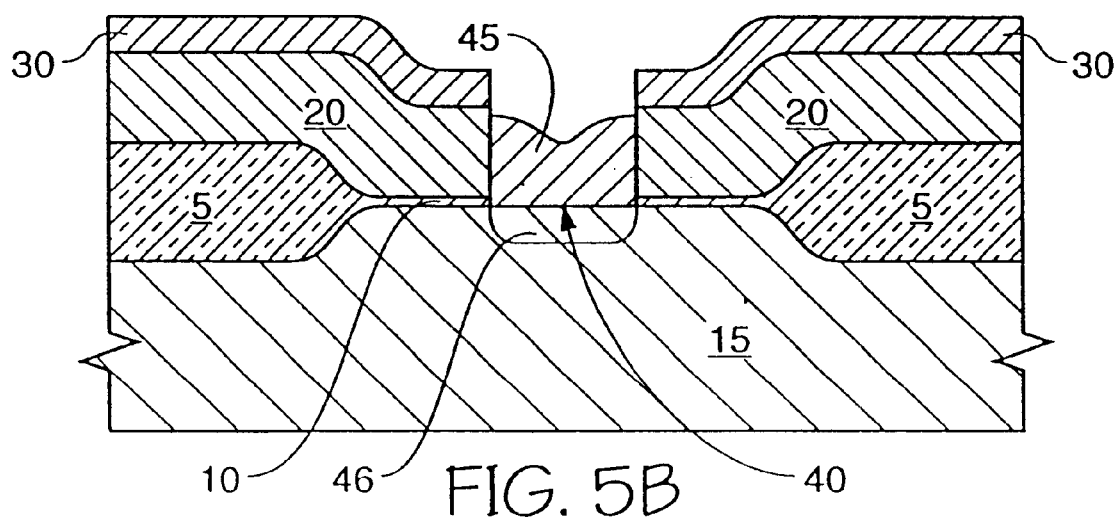

In the second embodiment, see FIG. 5B a polycrystalline silicon etch is used to remove the poly 2 layer 45 overlying the poly 1 layer 20 and etch stop layer 30. In this case it can be seen that the total height of the poly 1 layer 20 and the etch stop layer 30 defines the maximum height of the poly 2 layer 45 after the etch. However, the etch typically consumes additional portions of poly 2 layer 45 such that the upper portion of the poly 2 layer 45 is below the surface of the etch stop layer 30. After removal of the poly 2 layer 45 overlying the poly 1 layer 20 the second polycrystalline silicon layer 45 remaining in via 41 forms a contact plug in electrical contact with buried contact portion 40.

In all of the embodiments the first and second polycrystalline silicon layers are doped to increase conductivity. The preferred doping comprises implanting arsenic and then performing an anneal to diffuse the arsenic. A doped region 46 is created in the buried contact portion 40 of the substrate by diffusion or other means. The doped region 46 typically contacts other diffusion regions in the substrate which are not shown in the present figures but which are well known to those skilled in the art. The exact point or points in the process where doping is performed is subject to manufacturing considerations and is therefore determined at the time of manufacture by a person skilled in the art.

At this junction the method may proceed along two alternate paths to form the contact plug of the invention. FIGS. 6 and 7 represent the first path and FIGS. 8–12 represent the second path.

Figure 6A:
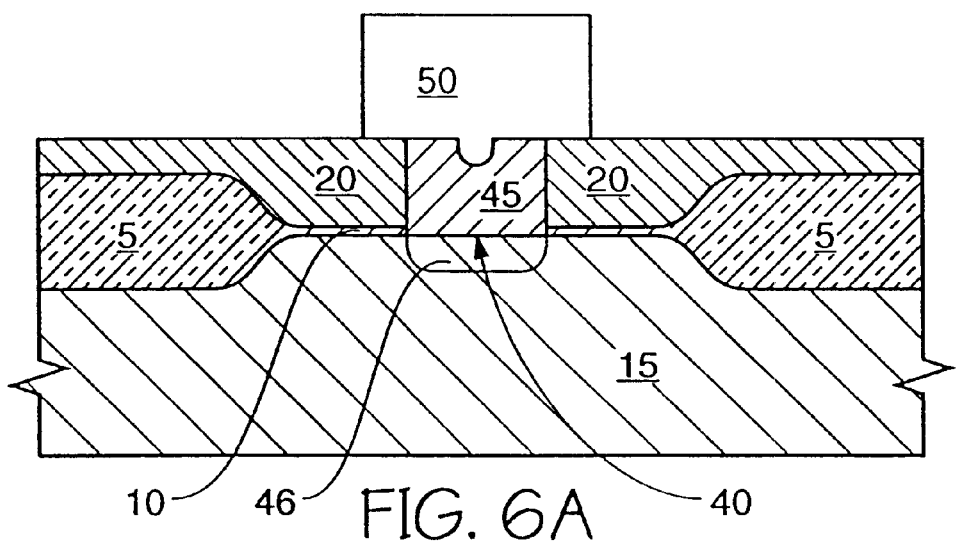
In FIGS. 6A and 6B a gate region has been patterned.
Figure 6B:
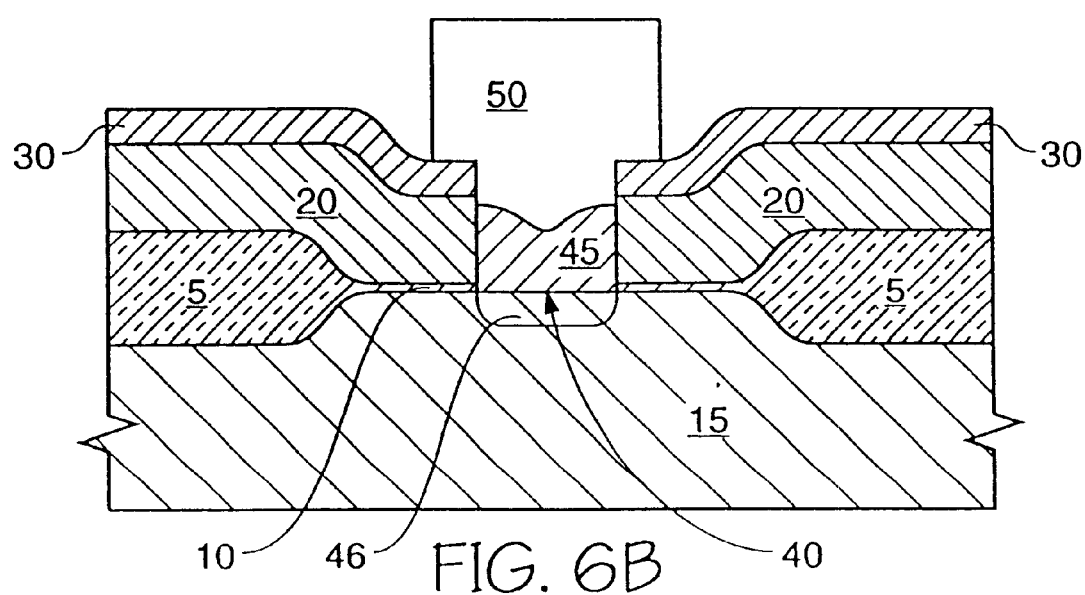

In FIGS. 6A and 6B the first polycrystalline silicon layer 20 is patterned with a photoresist mask 50 to define an electrical interconnect comprising the contact plug of polycrystalline silicon layer 45 and the first polycrystalline silicon layer 20. The electrical interconnect may have different functions and is patterned according to the function desired. In addition to providing electrical access to the buried contact portion 40 the contact plug may form a gate for a field effect transistor or may provide electrical contact to further circuit components. If the photoresist mask 50 is designed to overlap the upper surface of the second poly 2 layer 45 the trenching and exposure of the substrate is eliminated during the etch of the poly 1 layer 20. An optional oxide layer may be deposited to overlie the poly 1 and poly 2 layers 20 and 45 prior to the masking.

Figure 7A:
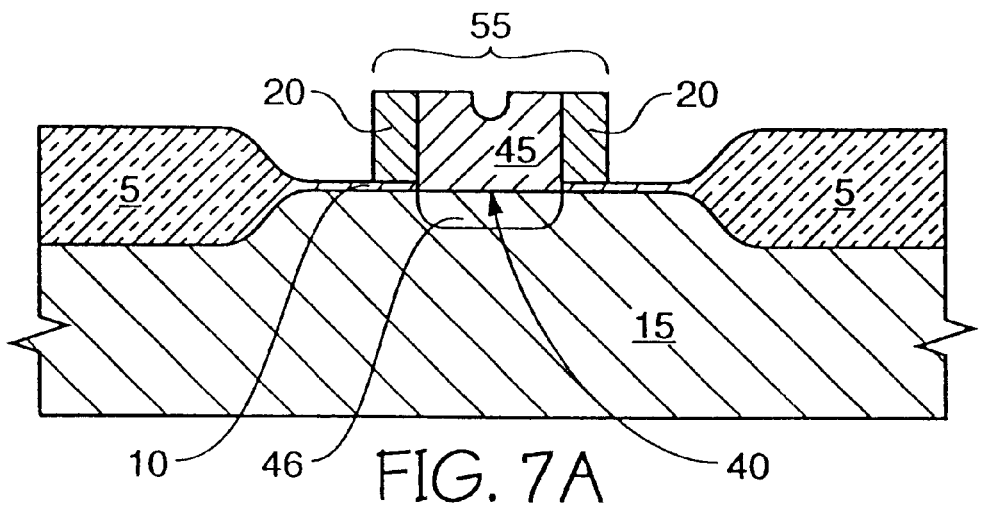
In FIGS. 7A and 7B the first polycrystalline silicon layer has been etched to form the gate region.
Figure 7B:
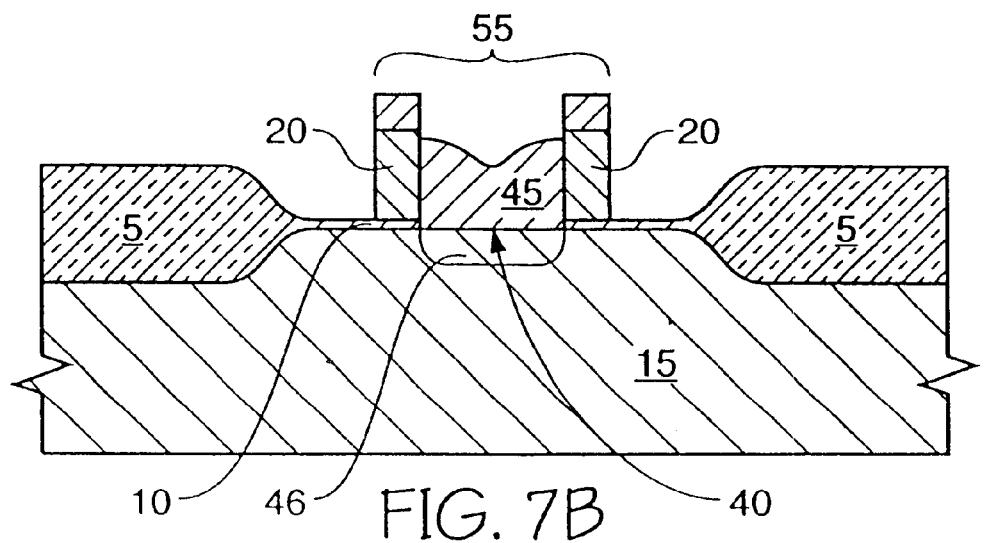

The poly 1 layer 20, and the optional oxide layer when deposited, in FIG. 6A and etch stop layer 30 in FIG. 6B are then etched in exposed areas. The photoresist mask 50 is then removed to form the electrical interconnect 55 comprising the contact plug and polycrystalline silicon layer 20 as shown in FIGS. 7A and 7B for the first and second embodiments, respectively.

Figure 8:
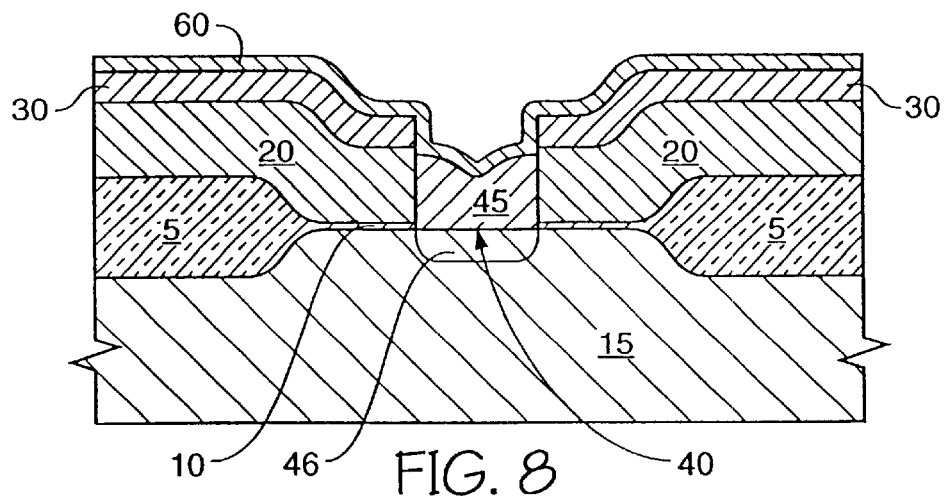
Figure 9:
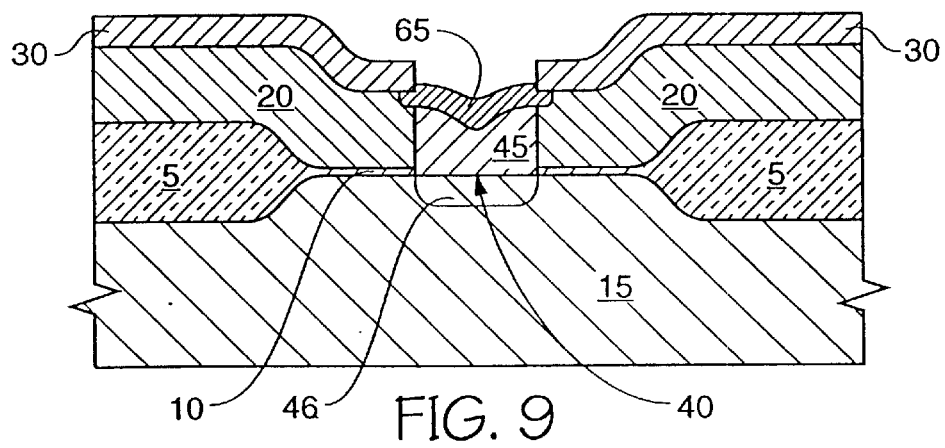

In the second path a titanium layer 60 is deposited to overlie the etch stop layer 30 and the poly 2 layer 45 of FIG. 6B, see FIG. 8.

Next the structure is heated to a temperature conducive to forming titanium silicide. The poly 2 layer 45 reacts with the titanium during heating to form titanium silicide which functions as a silicon etch stop layer 65, see FIG. 9. The nonreacted titanium 60 overlying the etch stop layer 30 is removed following the formation of the titanium silicide 65, also see FIG. 9. The etch stop layer 30 functions as a protective layer prohibiting a reaction between the titanium layer 60 and the poly 1 layer 20 during the reaction of the poly 2 layer 45 with the titanium layer 60.

Optionally, in place of a titanium deposit 60 and subsequent formation of etch stop layer 65 of titanium silicide, oxide may be grown overlying poly 2 layer 45 during an anneal. The result is similar to the structure shown in FIG. 9. However in this case the etch stop layer 30 is nitride and the etch stop layer 65 is oxide.

Figure 10:
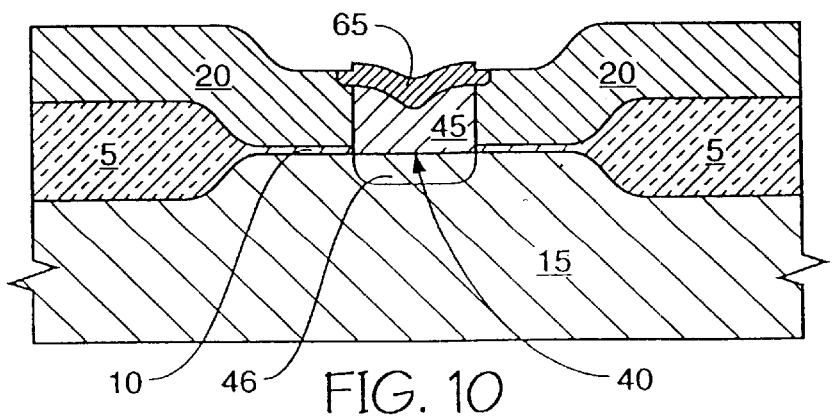

In either case, the etch stop layer 30 may be removed subsequent to the formation of etch stop layer 65, see FIG. 10.

Figure 11:
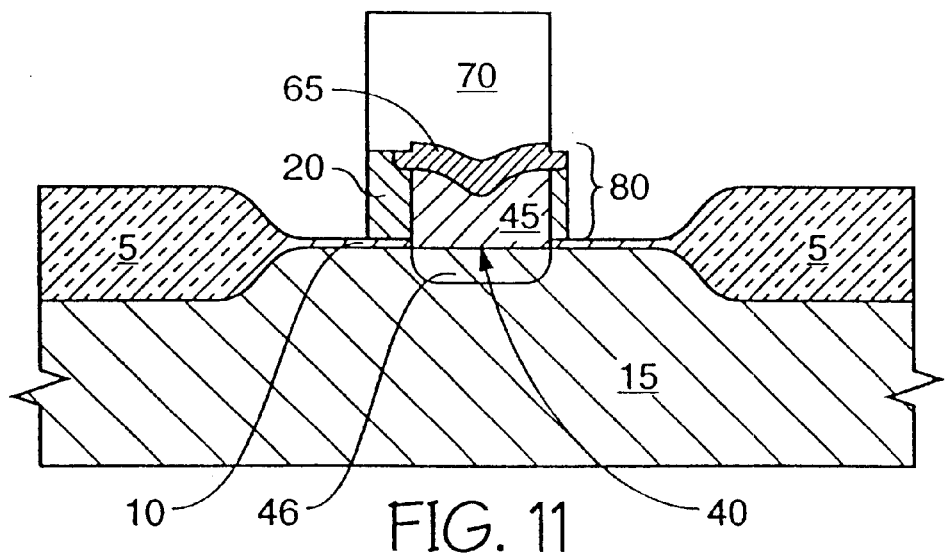

The electrical interconnect is patterned with photoresist mask 70 in FIG. 11. The poly 1 layer 20, and etch stop layer 30 if not already removed, is removed in exposed regions. Since silicon is selectively etchable over the etch stop layer 65 trenching and exposure of the substrate are eliminated during the etch of the poly 1 layer 20 due to the protection afforded the substrate by the etch stop layer 65, either titanium silicide or oxide, during the etch. The etch stop layer 65 is used during the formation of the electrical interconnect 80 to protect the second polycrystalline silicon 45 during the formation of the electrical interconnect 80. The polycrystalline silicon etch is highly selective over titanium silicide or oxide. By using this path of the second embodiment it is possible to eliminate trenching and exposure of the substrate even with gross misalignment of the photoresist mask.

Figure 12:
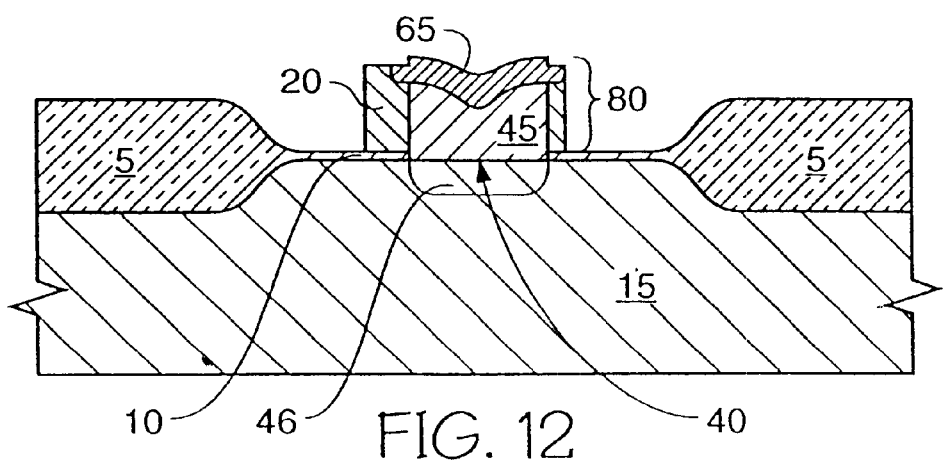

The electrical interconnect 80 and the contact plug formed from poly 2 layer 45 are shown following the removal of the photoresist mask 70 in FIG. 12. Since it was not necessary to use a contact cap to form the interconnect 80 parasitic transistor formation is eliminated. In addition cell size is reduced over methods using a contact cap.

The electrical interconnect formed by the method of the invention may be used in the manufacture of static random access memories (SRAMs) as well as dynamic random access memories.

Although the present invention has been described with reference to particular embodiments, other versions are possible and will be apparent to individuals skilled in the art. The invention therefore, is not limited to the specific features and elements shown. It is intended that the scope of the invention be defined by the appended claims and in accordance with the doctrine of equivalents.

What is claimed is:

1. A method for forming an electrical interconnect, comprising:
   creating a first electrically conductive layer overlying a substrate;
   creating a first etch stop layer overlying said first electrically conductive layer;
   patterning said first electrically conductive layer and said etch stop layer to create a masked region and an unmasked region;
   exposing the substrate in said unmasked region, thereby forming a via having a sidewall comprising said first electrically conductive layer and said etch stop layer;
   creating a second electrically conductive layer to overlie said etch stop layer and the substrate, the first and the second electrically conductive layers comprising polycrystalline silicon;
   etching a portion of said second electrically conductive layer to expose said etch stop layer; at least a portion of said second electrically conductive layer remaining in electrical contact with the substrate to form an electrical plug portion of the electrical interconnect;
   creating, overlying said first etch stop layer and the electrical plug portion, a layer which is capable of reacting with said second electrically conductive layer to form a layer which is irresponsive to an etchant which is capable of etching said second electrically conductive layer;
   creating a reaction between said layer which is capable of reacting with said second electrically conductive layer and the electrical plug portion to form a second etch stop layer overlying the electrical plug portion of the second electrically conductive layer, said first etch stop layer protecting said first electrically conductive layer from reacting with said layer which is capable of reacting with said second electrically conductive layer during said step of creating said reaction;
   removing unreacted portions of said layer which is capable of reacting with said second electrically conductive layer;
   removing at least portions of said first etch stop layer while retaining said second etch stop layer; and
   removing at least portions of said first electrically conductive layer, while retaining the electrical plug in its entirety during said removing to form the electrical interconnect of the electrical plug and the remaining portion of the first electrically conductive layer.

2. The method as claimed in claim 1, including doping the polycrystalline silicon to increase its conductivity.

3. The method of claim 2, wherein a material used to perform the doping is arsenic.

4. The method as claimed in claim 1 wherein the layer capable of reacting with said second electrically conductive layer is titanium.

5. The method as claimed in claim 1 wherein the second etch stop layer comprises titanium silicide.

6. A method for forming an electrical interconnect, comprising:
   creating a first layer of polycrystalline silicon overlying a substrate;
   creating a first etch stop layer overlying said first layer of polycrystalline silicon;
   patterning said first layer of polycrystalline silicon and said first etch stop layer to create a masked region and an unmasked region;
   exposing the substrate in said unmasked region, thereby forming a via having a sidewall comprising said first layer of polycrystalline silicon and said etch stop layer;
   creating a second layer of polycrystalline silicon to overlie said first etch stop layer and the substrate;
   etching a portion of said second layer of polycrystalline silicon to expose said first etch stop layer; at least a portion of said second layer of polycrystalline silicon remaining in electrical contact with the substrate to form an electrical plug portion of the electrical interconnect;
   creating, overlying said first etch stop layer and the electrical plug portion, a further layer which is capable of reacting with said second layer of polycrystalline silicon to form a layer which is irresponsive to an etchant which is capable of etching said layer of polycrystalline silicon;
   creating a reaction between said further layer and the electrical plug portion to form a second etch stop layer overlying the electrical plug portion, said first etch stop layer protecting said first layer of polycrystalline silicon from reacting with said further layer during said step of creating said reaction;
   removing unreacted portions of said further layer;
   removing at least portions of said first etch stop layer while retaining said second etch stop layer; and
   removing at least portions of said first layer of polycrystalline silicon, while retaining the electrical plug portion in its entirety during said removing to form the electrical interconnect.

7. The method as claimed in claim 6 wherein the first and second polycrystalline silicon layers are doped.

8. The method as claimed in claim 6 wherein the first and second polycrystalline silicon layers are doped with arsenic.

9. The method as claimed in claim 6 wherein the further layer is titanium.

10. The method as claimed in claim 6 wherein the second etch stop layer comprises titanium silicide.

11. A method for forming an electrical interconnect, comprising:

creating a first layer of polycrystalline silicon overlying a substrate;

creating a first etch stop layer overlying said first layer of polycrystalline silicon;

forming a via through the first etch stop layer and the first layer of polycrystalline silicon, the via having a sidewall comprising said first layer of polycrystalline silicon and said etch stop layer;

creating a second layer of polycrystalline silicon to overlie said first etch stop layer and the substrate;

etching a portion of said second layer of polycrystalline silicon to expose said first etch stop layer; at least a portion of said second layer of polycrystalline silicon remaining in electrical contact with the substrate to form an electrical plug portion of the electrical interconnect;

creating, overlying said first etch stop layer and the electrical plug portion, a further layer which is capable of reacting with said second layer of polycrystalline silicon to form a layer which is irresponsive to an etchant which is capable of etching said second layer of polycrystalline silicon;

creating a reaction between said further layer and the electrical plug portion to form a second etch stop layer overlying the electrical plug portion, said first etch stop layer protecting said first layer of polycrystalline silicon from reacting with said further layer during said step of creating said reaction;

removing unreacted portions of said further layer;

removing at least portions of said first etch stop layer while retaining said second etch stop layer; and removing at least portions of said first layer of polycrystalline silicon, while retaining the electrical plug portion in its entirety during said removing to form the electrical interconnect.

12. The method as claimed in claim 11 wherein the first and second polycrystalline silicon layers are doped.

13. The method as claimed in claim 11 wherein the first and second polycrystalline silicon layers are doped with arsenic.

14. The method as claimed in claim 11 wherein the further layer is titanium.

15. The method as claimed in claim 11 wherein the second etch stop layer comprises titanium silicide.

16. A method for forming an electrical interconnect, comprising:

creating a first layer of polycrystalline silicon overlying a substrate;

creating a first etch stop layer overlying said first layer of polycrystalline silicon;

forming a via through the first etch stop layer and the first layer of polycrystalline silicon;

creating a second layer of polycrystalline silicon to overlie said first etch stop layer, fill the via and overlie the substrate;

etching a portion of said second layer of polycrystalline silicon to remove the second layer of polycrystalline from the first etch stop layer; at least a portion of said second layer of polycrystalline silicon remaining in the via in electrical contact with the substrate to form an electrical plug portion of the electrical interconnect;

creating, overlying said first etch stop layer and the electrical plug portion, a further layer which is capable of reacting with said second layer of polycrystalline silicon to form a layer which is irresponsive to an etchant which is capable of etching said second layer of polycrystalline silicon;

creating a reaction between said further layer and the electrical plug portion to form a second etch stop layer overlying the electrical plug portion, said first etch stop layer protecting said first layer of polycrystalline silicon from reacting with said further layer during said step of creating said reaction;

removing unreacted portions of said further layer;

removing at least portions of said first etch stop layer while retaining said second etch stop layer; and removing at least portions of said first layer of polycrystalline silicon, while retaining the electrical plug portion in its entirety during said removing to form the electrical interconnect.

17. The method as claimed in claim 16 wherein the first and second polycrystalline silicon layers are doped.

18. The method as claimed in claim 16 wherein the first and second polycrystalline silicon layers are doped with arsenic.

19. The method as claimed in claim 16 wherein the further layer is titanium.

20. The method as claimed in claim 16 wherein the second etch stop layer comprises titanium silicide.

21. A method for forming an electrical interconnect, comprising:

creating a first layer of polycrystalline silicon overlying a substrate;

creating a first etch stop layer overlying said first layer of polycrystalline silicon;

forming a via though the first etch stop layer and the first layer of polycrystalline silicon;

creating a second layer of polycrystalline silicon to overlie said first etch stop layer, fill the via and overlie the substrate;

etching a portion of said second layer of polycrystalline silicon to remove the second layer of polycrystalline from the first etch stop layer; at least a portion of said second layer of polycrystalline silicon remaining in the via in electrical contact with the substrate to form an electrical plug portion of the electrical interconnect;

forming a conductive layer above said first etch stop layer and the electrical plug portion;

reacting the conductive layer with said second layer of polycrystalline silicon to form a second etch stop layer above the electrical plug portion; and etching the conductive layer but not the second etch stop layer and removing unreacted portions of said conductive layer without removing said second etch stop layer.

22. The method as claimed in claim 21 wherein the first and second polycrystalline silicon layers are doped.

23. The method as claimed in claim 21 wherein the first and second polycrystalline silicon layers are doped with arsenic.

24. The method as claimed in claim 21 wherein the conductive layer is titanium.

25. The method as claimed in claim 21 wherein the second etch stop layer comprises titanium silicide.

26. A method for forming an electrical interconnect, comprising:

creating a first layer of polycrystalline silicon overlying a substrate;

creating a first etch stop layer overlying said first layer of polycrystalline silicon;

forming a via through the first etch stop layer and the first layer of polycrystalline silicon;

creating a second layer of polycrystalline silicon to overlie said first etch stop layer, fill the via and overlie the substrate;

etching a portion of said second layer of polycrystalline silicon to remove the second layer of polycrystalline from the first etch stop layer; at least a portion of said second layer of polycrystalline silicon remaining in the via in electrical contact with the substrate to form an electrical plug portion of the electrical interconnect;

creating, overlying said first etch stop layer and the electrical plug portion, a conductive layer which is capable of reacting with the portion of the second layer of polycrystalline silicon remaining, to form a second etch stop layer;

reacting the conductive layer with the electrical plug portion to form a second etch stop layer, said first etch stop layer protecting said first layer of polycrystalline silicon from reacting with said conductive layer; and etching unreacted portions of said conductive layer to expose the first etch stop layer.

27. The method as claimed in claim 26 wherein the first and second polycrystalline silicon layers are doped.

28. The method as claimed in claim 26 wherein the first and second polycrystalline silicon layers are doped with arsenic.

29. The method as claimed in claim 26 wherein the conductive layer is titanium.

30. The method as claimed in claim 26 wherein the second etch stop layer comprises titanium suicide.

31. A method for forming an electrical interconnect, comprising:

creating a first layer of polycrystalline silicon overlying a substrate;

creating a first etch stop layer overlying said first layer of polycrystalline silicon;

patterning said first layer of polycrystalline silicon and said first etch stop layer to create a masked region and an unmasked region;

exposing the substrate in said unmasked region, thereby forming a via having a sidewall comprising said first layer of polycrystalline silicon and said etch stop layer;

creating a second layer of polycrystalline silicon overlying said first etch stop layer and the substrate;

etching a portion of said second layer of polycrystalline silicon to expose said first etch stop layer; at least a portion of said second layer of polycrystalline silicon remaining in electrical contact with the substrate to form an electrical plug portion;

creating, overlying said first etch stop layer and the electrical plug portion, a conductive layer which is capable of reacting with the portion of the second layer of polycrystalline silicon remaining, to form a second etch stop layer;

reacting the conductive layer with the electrical plug portion to form a second etch stop layer, said first etch stop layer protecting said first layer of polycrystalline silicon from reacting with said conductive layer; and etching unreacted portions of said conductive layer to expose the first etch stop layer.

32. The method as claimed in claim 31 wherein the first and second polycrystalline silicon layers are doped.

33. The method as claimed in claim 31 wherein the first and second polycrystalline silicon layers are doped with arsenic.

34. The method as claimed in claim 31 wherein the conductive layer is titanium.

35. The method as claimed in claim 31 wherein the second etch stop layer comprises titanium silicide.

36. A method for forming an electrical interconnect, comprising:

creating a first layer of polycrystalline silicon overlying a substrate;

creating a first etch stop layer overlying said first layer of polycrystalline silicon;

forming a via through the first etch stop layer and the first layer of polycrystalline silicon;

creating a second layer of polycrystalline silicon to overlie said first etch stop layer, fill the via and overlie the substrate;

etching a portion of said second layer of polycrystalline silicon to remove the second layer of polycrystalline from the first etch stop layer; at least a portion of said second layer of polycrystalline silicon remaining in the via in electrical contact with the substrate to form an electrical plug portion of the electrical interconnect;

creating, overlying said first etch stop layer and the electrical plug portion, a [third] conductive layer which is capable of reacting with the portion of the second layer of polycrystalline silicon remaining, to form a second etch stop layer;

reacting the conductive layer with the electrical plug portion to form a second etch stop layer, said first etch stop layer protecting said first layer of polycrystalline silicon from reacting with said third conductive layer;

etching unreacted portions of said third conductive layer to expose the first etch stop layer; and selectively removing the first etch stop layer while retaining a portion of the second polycrystalline silicon layer adjacent the electrical plug portion.

37. The method as claimed in claim 36 wherein the first and second polycrystalline silicon layers are doped.

38. The method as claimed in claim 36 wherein the first and second polycrystalline silicon layers are doped with arsenic.

39. The method as claimed in claim 36 wherein the third conductive layer is titanium.

40. The method as claimed in claim 36 wherein the second etch stop layer comprises titanium silicide.

* * * * *

UNITED STATES PATENT AND TRADEMARK OFFICE
CERTIFICATE OF CORRECTION

PATENT NO.    : 6,596,632 B2
DATED         : July 22, 2003
INVENTOR(S)   : Martin C. Roberts and Sanh D. Tang It is certified that error appears in the above-identified patent and that said Letters Patent is hereby corrected as shown below:

Column 8,
Line 41, delete "though" and insert -- through -- therefor.

Column 9,
Line 40, delete "suicide" and insert -- silicide -- therefor.

Column 10,
Line 40, delete "[third]" before "conductive".

Signed and Sealed this

Ninth Day of December, 2003

JAMES E. ROGAN
*Director of the United States Patent and Trademark Office*